United States Patent
Magruder et al.

(10) Patent No.: US 6,400,106 B1
(45) Date of Patent: Jun. 4, 2002

(54) DEVICE FOR REDUCING ELECTROMAGNETIC EMISSIONS OF A CIRCUIT THROUGH VOLTAGE AND CURRENT SLEWING

(75) Inventors: Angela Murch Magruder, Rochester Hills, MI (US); Alfons Fisch, Falkenstein (DE)

(73) Assignee: Siemens Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/430,744

(22) Filed: Oct. 29, 1999

Related U.S. Application Data

(60) Provisional application No. 60/106,345, filed on Oct. 30, 1998, and provisional application No. 60/106,346, filed on Oct. 30, 1998.

(51) Int. Cl.[7] .................................................. H02P 1/18
(52) U.S. Cl. ........................ 318/254; 323/268; 323/271; 323/285; 307/24
(58) Field of Search ................................ 318/254, 432, 318/454, 132, 439, 798–812; 323/268, 271, 282, 285, 288; 307/24

(56) References Cited

U.S. PATENT DOCUMENTS

| | | | | |
|---|---|---|---|---|
| 4,274,042 A | * | 6/1981 | Walker et al. ............... | 318/803 |
| 5,397,967 A | * | 3/1995 | Carobolante et al. ........ | 318/254 |
| 5,949,249 A | * | 9/1999 | Preuss et al. .................. | 326/27 |
| 5,952,817 A | * | 9/1999 | Brewster et al. ............ | 323/268 |
| 6,040,686 A | * | 3/2000 | Schenkel ..................... | 323/282 |

FOREIGN PATENT DOCUMENTS

| | | |
|---|---|---|
| EP | 0493185 | 1/1992 |
| GB | 2318467 | 4/1998 |
| WO | WO 95/24076 | 9/1995 |

OTHER PUBLICATIONS

Yee H P: "An EMI Suppression MOSFET Driver", APEC. Annual Applied Electronics Conference and Exposition, US, New York, IEEE, vol. Conf. 12, pp. 242–248.

* cited by examiner

Primary Examiner—David S. Martin

(57) ABSTRACT

An inductive load is managed to reduce unnecessary induced electromagnetic radiation as caused by unwanted voltage and/or current fluctuations. The management is accomplished through combined current and voltage slew rate limiting of a transistor driving the inductive load. This management may be effected through a combination of analog and digital circuitry.

13 Claims, 7 Drawing Sheets

DEVICE FOR REDUCING ELECTROMAGNETIC EMISSIONS OF A CIRCUIT THROUGH VOLTAGE AND CURRENT SLEWING

CROSS-REFERENCE TO RELATED APPLICATIONS

This application is a continuation of U.S. Provisional Applications Serial No. 60/106,345, filed Oct. 30, 1998, and of U.S. Provisional Application Serial No. 60/106,346, also filed Oct. 30, 1998.

BACKGROUND OF THE INVENTION

1. Technical Field of the Invention

This invention relates generally to the field of electrical circuits and component design, and more specifically to an improved transistor driver circuit.

2. Background Information and Description of the Related Art (Including Information Disclosed Under 37 CFR §§1.97 and 1.98)

Nearly every household and consumer device manufactured today includes some form of electronic or electromechanical control. Electronics have greatly improved the functionality and convenience of these devices. However, having electronic controls also makes the device susceptible to interference from ambient electromagnetic signals. One goal, then, of good electrical and electronic circuit design is to minimize the magnitude of electromagnetic interference generated, or radiated, by each device. In so doing, the device will become a good neighbor to other electrical and electronic devices in its vicinity.

One field where it is important to minimize the generation of spurious electromagnetic signals is in automotive control systems. Vehicles have a number of sensitive control systems, managing aspects as diverse as engine operation, braking, transmission shifting, navigational tracking and positioning, and extra-vehicle communications. Vehicle manufacturers have strict requirements on electromagnetic (EM) radiation. This is necessary to ensure that one device does not interfere with the operation of a neighboring device.

Certain vehicle control systems present a greater challenge when dealing with radiant EM. These systems include the control of inductive or resistive loads, such as solenoids, coils and relays, that must be switched off and on rapidly. Electronic components commonly referred to as output drivers (low side output drivers or high side output drivers) control the power to such loads. When dealing with control systems that rapidly switch output drivers and their associated driven elements, the amount of radiant EM can be quite high if not managed properly.

BRIEF SUMMARY OF THE INVENTION

This invention relates to a method for reducing electromagnetic radiation from a circuit employing transistor-based output drivers, and more specifically to a method for limiting the load current slew rate and the load voltage slew rate, slew rate being the rate of change of the current or voltage. Examples are given in this application for systems using a high side driver, but the concepts addressed in this patent application are equally applicable to other drive circuits, including low side drivers and H-bridges.

One advantage of the present invention is that the output driver slew rate limits are digitally configurable, allowing the slew rates to be optimized for any given load configuration.

Another advantage of the present invention is that the combination of voltage and current slew rate limiting allows the overall circuit performance to be optimized against radiant electromagnetic energy, more so than could be achieved by employing voltage or current slew rate limiting alone.

BRIEF DESCRIPTION OF THE SEVERAL DRAWINGS

One can better appreciate other aspects and advantages of the invention by reading the following specification in conjunction with the drawings in which.

DETAILED DESCRIPTION OF THE INVENTION

Figure 1:
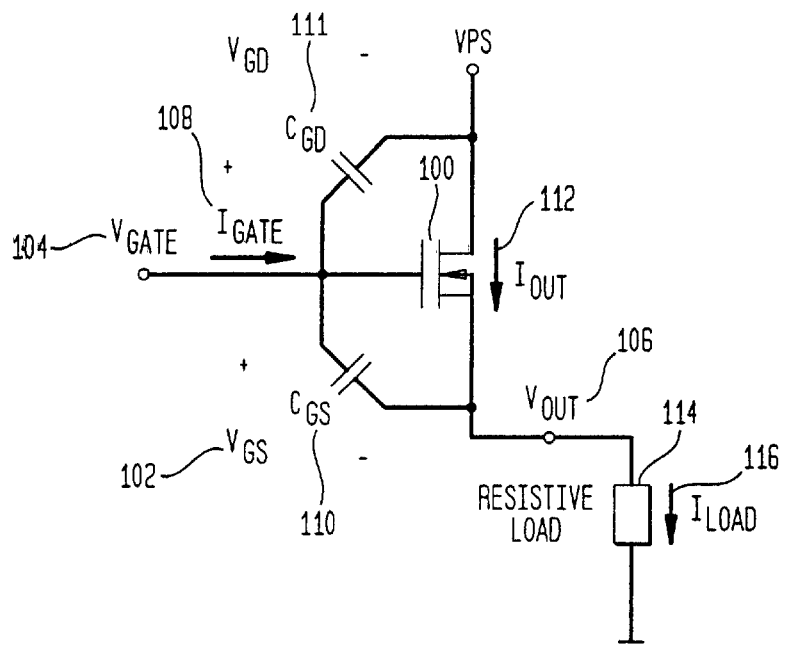
FIG. 1 is an illustrative circuit showing the transistor of an output driver attached to a resistive load.

As illustrated in FIG. 1, the output driver transistor 100 is turned on when $V_{GS}$ 102, the difference between the gate voltage potential ($V_{GATE}$) 104 and the source voltage potential ($V_{OUT}$) 106, exceeds the transistor threshold voltage ($V_{th}$). As ($V_{GATE}$) 104 rises from zero to $V_{th}$, a gate current ($I_{GATE}$) 108 flows to charge both the gate-source capacitance ($C_{GS}$) 110 and the drain-source capacitance ($C_{DS}$) 111 until ($V_{GATE}$) 104 reaches $V_{TH}$. This charging of the transistor's inherent capacitances will occur within a minimum time (here, referred to as $t_{CGS\_FULL\_MIN}$) if the gate current ($I_{GATE}$) 108 is unlimited, and if that current is allowed to flow at its maximum magnitude ($I_{GATE\_MAX}$). If, however, the gate current ($I_{GATE}$) 108 is limited to a value less than ($I_{GATE\_MAX}$), the time necessary for the gate-source and drain-source capacitances to fully charge ($t_{CGS\_FULL}$) will be greater than $t_{CGS\_FULL\_MIN}$. Represented mathematically, the relationship described here is:

If $I_{GATE} = I_{GATE\_MAX}$, then $t_{CGS\_FULL} = t_{CGS\_FULL\_MIN}$;

But, if $I_{GATE} < I_{GATE\_MAX}$, then $t_{CGS\_FULL} > t_{CGS\_FULL\_MIN}$ it being understood that $V_{GATE} \geq V_{TH}$ upon the expiry of $t_{CGS\_FULL}$. Once the gate voltage ($V_{GATE}$) 104 reaches and then exceeds $V_{th}$, current ($I_{OUT}$) 112 begins to flow through the transistor 100 through the drain-to-source path due to the inherent transconductance of the transistor. The transistor 100 may be connected to a resistive load 114, and during this state the load will have a current of $I_{LOAD}$ 116 which is equal to the output current ($I_{OUT}$) 112. All of this is well known to those of ordinary skill in the art.

Figure 2:
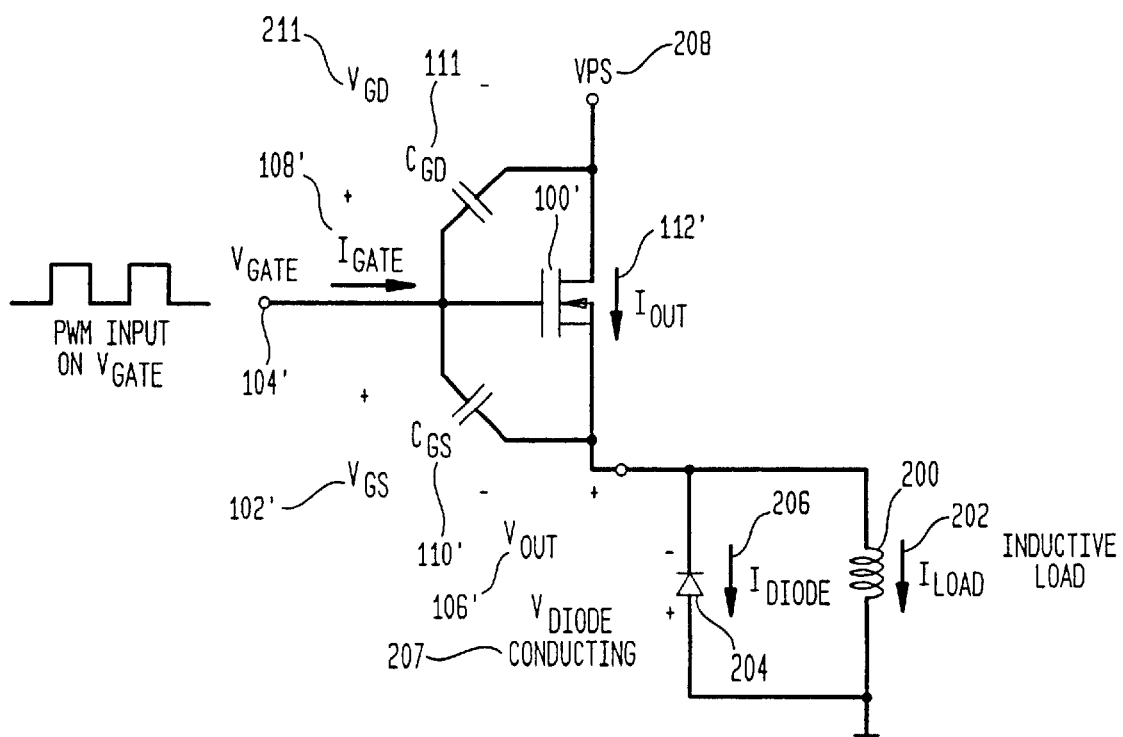
FIG. 2 is an illustrative circuit showing the transistor of an output driver attached to an inductive load with a freewheel diode, where the transistor is driven with a pulse-width modulated signal.

FIG. 2 builds upon these foundational concepts, this time including an output transistor 100' driven by a pulse width modulated (PWM) signal ($V_{GATE}$) 104'. A pulse width modulated signal cycles between being off and on, typically in a synchronous, or regular, manner. Each time the gate voltage ($V_{GATE}$) 104' cycles off, the output transistor 100' is turned off. When the transistor 100' cycles from on to off, the current ($I_{OUT}$) 112' that was flowing through the transistor 100' rapidly goes to zero. If there is an inductive load 200 in the circuit, rather than a resistive load 114, there is an imbalance created in the circuit. That is because the zero output current ($I_{OUT}$) 112' of the transistor 100' drives the current of the inductive load ($I_{LOAD}$) 202. However, it is well known to those of ordinary skill in the art that the current through an inductor cannot change instantaneously.

To compensate for this imbalance, a diode 204 is added to the circuit. Current ($I_{DIODE}$) 206 is drawn through the diode 204 to allow the inductive load current ($I_{LOAD}$) 202 to decrease at some slew, or change, rate inherent to the system. The time it takes for the load current ($I_{LOAD}$) 202 to dissipate depends upon the time constant ($\tau$) of the system, where this time constant is a function of the inductive load 200, the diode 204, and associated wiring interconnecting the various circuit elements. If the period of the PWM signal ($V_{GATE}$) 104' is significantly less than $\tau$, the load current ($I_{LOAD}$) 202 will be continuous and nearly of constant magnitude.

While the diode 204 is conducting, the transistor source voltage ($V_{OUT}$) 106' is negative, and is of a magnitude equal to the conducting voltage ($V_{DIODE}$) 207 of diode 204. Since the gate-source capacitance ($C_{GS}$) 110' was already fully charged when the gate was on, the drain-gate capacitance ($C_{GD}$) 111' accumulates more charge due to the increased voltage difference between the drain and the source.

When the PWM signal 104' goes high and the transistor is turned on again, the gate-source capacitance ($C_{GS}$) 110' is charged until the gate-source voltage ($V_{GS}$) 102' again reaches the threshold $V_{TH}$. As the gate-source voltage 102' continues to rise, two things happen essentially simultaneously. First, the current through the transistor ($I_{OUT}$) 112' increases from zero to the limit defined by the system components. Second, the current through the diode 204 decreases to zero as the source voltage ($V_{OUT}$) 106' again becomes positive, and the diode 204 is reverse biased. The output voltage ($V_{OUT}$) 106' rises from below zero towards the power supply voltage ($V_{PS}$) 208. As the output voltage 106' rises and the gate-source voltage ($V_{GS}$) 102' stays close to $V_{TH}$, the gate-drain voltage ($V_{GD}$) 211 decreases. The drain-gate capacitance 111' releases its excess charge. The rate of voltage change is that value which brings $I_{GATE}$ 108' equal to the discharging current of the gate-drain capacitance. This discharge continues until the output voltage 106' reaches its maximum (that being, the power supply voltage minus drain-source "on" voltage) and the drain-source voltage reaches a steady state. This is commonly referred to as the Miller effect. This whole process is reversed when the transistor is shut off.

The electromagnetic (EM) emissions from such a system are at a maximum during two different critical stages of circuit transition. The first stage during which maximum EM is emitted is when the output current ($I_{OUT}$) 112' is changing, either increasing or decreasing. The second stage during which maximum EM is emitted is when the output voltage ($V_{OUT}$) 106' is changing, likewise either increasing or decreasing. The EM emissions during these transitional stages can be reduced by slowing the rate of change of these parameters. To be precise, by limiting the rate at which the current ($I_{OUT}$) 112' and voltage ($V_{OUT}$) 106' are changing, that is, by limiting the slew rate of the current and voltage, EM emissions can be managed to be at levels below their otherwise naturally occurring maximum level. This can be accomplished through limitation of the gate current ($I_{GATE}$) 108'.

Figure 3:
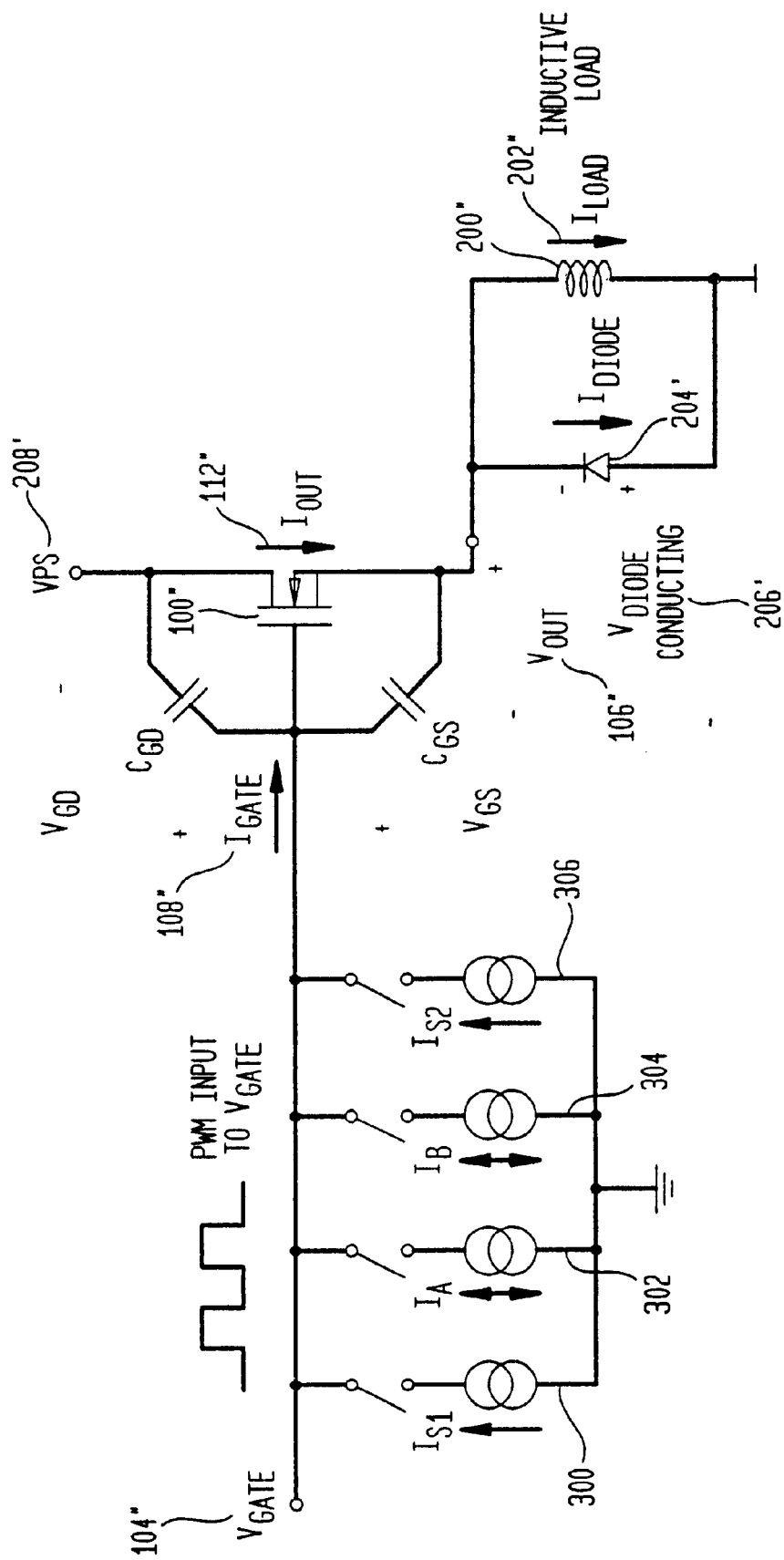
FIG. 3 is a circuit similar to that of FIG. 2 with the addition of a switchable transistor gate drive current.

FIGS. 1 and 2 describe phenomena generally well understood by those of ordinary skill in the art. Turning now to FIG. 3, the present invention will be described. FIG. 3 is a circuit of the type described in FIG. 2, with the addition of illustrative switched gate current sources 300–306. These gate current sources 300–306 represent the magnitude of the gate current 108'' at different stages in the operation of the circuit, and do not necessarily reflect the physical implementation in the device. More specifically, current source 300 represents a gate current to the limit $\pm I_{S1}$, current source 302 represents a gate current to the limit $\pm I_A$, current source 304 represents a gate current to the limit $\pm I_B$, and current source 306 represents a gate current to the limit $\pm I_{S2}$. The relative magnitudes of these current limits are determined by the needs of the situation. Typically $I_A$ and $I_B$ will be much smaller in magnitude than $I_{S1}$, or $I_{S2}$. The relationship of the magnitude of the currents with respect to each other depend on the transconductance of the device and on the load characteristics.

Figure 4:
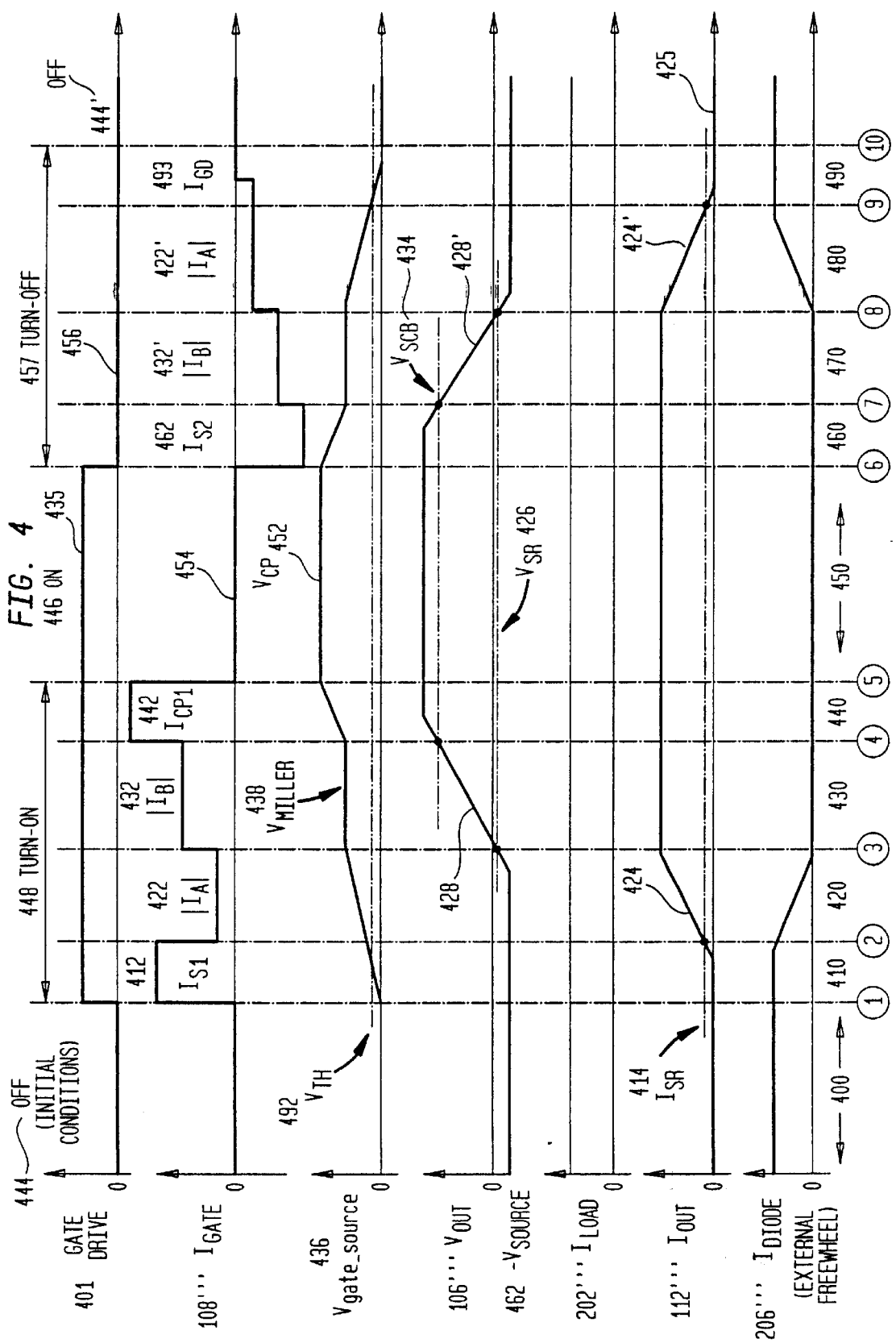
FIG. 4 is a signal diagram showing ideal waveforms generated by an inductive load operating in a pulse-width modulated mode with switched gate currents, such as the circuit of FIG. 3.

FIG. 4 illustrates the ideal waveforms generated by the circuit of FIG. 3. Both FIGS. 3 and 4 are referred to in this portion of the discussion.

The initial conditions 400 in FIG. 4 assume that the transistor is off with a continuous load current ($I_{LOAD}$) 202'''. Recalling the discussion of FIG. 2, this is because the period (T) of the PWM input signal ($V_{GATE}$) 104'' is much smaller than the time constant of the system ($\tau$). Because of this phenomenon, the output voltage ($V_{OUT}$) 106'', 106''' is negative with a magnitude equal to the diode conducting voltage 206'.

Current source 300 is figuratively switched on during phase 410, to represent that the gate current ($I_{GATE}$) 108'', 108''' is now at level $I_{S1}$, 412. Doing so reduces the total switching time of the circuit, this total switching time being the time from when the digital "on" signal 401 reaches 50% of its maximum voltage the time that the output voltage ($I_{OUT}$) 106'', 106''' reaches 90% of its maximum (when turning on). When the output current 112'', 112''' begins to increase, EM radiation becomes an issue. To manage radiant EM, the output current slew rate should ideally be limited.

Once the output current 112'', 112''' reaches the arbitary threshold $I_{SR}$ 414, the gate current 108'', 108''' limit is reduced to level $I_A$ 422. This is symbolized in FIG. 3 as current limit source 302 switching on and current source 300 switching off. During this phase 420, the output current slew rate 424 is limited. As the current flows more through the transistor 100'' and less through the diode 204', the diode 204' stops conducting and the output voltage ($V_{OUT}$) 106'', 106''' begins to rise. At this point, the change in voltage begins causing radiant EM. Therefore, it now becomes necessary to manage voltage slew to effectively manage radiant EM.

Once the arbitrary voltage threshold $V_{SR}$ 426 has been reached, it becomes desirable to control the voltage slew rate 428. This is represented by the circuit leaving stage 420 and entering stage 430. During this stage 430, the gate current 108'', 108''' is changed to level $I_B$ 432. This is symbolized in FIG. 3 as current limit source 304 switching on and current limit source 302 switching off. During this stage 430, the output voltage slew rate 428 is controlled.

Once the output voltage is no longer rapidly changing, the voltage slew rate 428 need not be controlled anymore. Instead, it now becomes desirable to speed up, or minimize, the time it takes for the transistor 100'' to reach the state where the output voltage 106", 106'" is maximized and the transistor drain-source voltage (that is, $V_{PS}$ 208' less $V_{OUT}$ 106") 436 reaches steady state.

This stage of operation is shown as stage 440. For stage 440, current source 304 is figuratively switched off after ($V_{OUT}$) 106", 106'" crosses arbitrary threshold $V_{SCB}$ 434. Figurative current source 304 is switched off and the circuit is allowed to seek its natural maximum gate current 108", 108'", shown as level $I_{CP1}$ 442.

It can be appreciated by those of ordinary skill in the art that stages 410–440 represent the stages during which the transistor 100" is transitioning from being "off" 444 until it is fully "on" 446. The cumulative effect of stages 410–440 thus represent the "turn-on" state 448 of the transistor 100".

At the end of the final stage 440 of the "turn on" state 448, the "on" state 446 has been achieved. This is represented in the signal diagram of FIG. 4 as stage 450. During this stage 450, the gate voltage ($V_{GATE}$) 104", 104'" is at the maximum value provided by the circuitry. This value is represented as $V_{CP}$ 452. Also during this stage 450, the transistor drain-source resistance, commonly referred to by those of ordinary skill as $R_{DSON}$, is at a minimum. During this state, the system is in equilibrium, and no gate current 108", 108'" is required to maintain the equilibrium. As such, the gate current 108", 108'" drops to zero 454.

At some point in time, the PWM signal 401 switches from "on" 435 to "off" 456, setting the stage for a reverse of the phenomena experienced during the "turn on" 448 and "on" 446 states. The transistor 100" now begins its "turn off" 457 state. The first stage of the "turn off" state 457 is stage 460. During this stage 460, the PWM signal 401 is brought to "off" 456. As described initially in FIGS. 1 and 2, this causes the output current ($I_{OUT}$) 112", 112'" to be driven toward zero 425. However, because of the presence of an inductive load 200", the load current 202" cannot react quickly. To maintain balance in the circuit, diode 204' conducts current. This causes ($V_{OUT}$) 106", 106'" to eventually become negative with a magnitude equal to the conducting voltage of the diode ($V_{DIODE}$) 462.

When "turning on" 448 the device, stages 410–440, current sources 300–306 were used to represent current being sourced to the gate of the transistor. When "turning off" 457 the device, current sources 300–306 are used to represent a current sink for the gate. The magnitude of the current source 300–306 limits may be equivalent in either mode, but one of ordinary skill in the art appreciates that the polarity of the current will be opposite for the cases of turning on and turning off.

During stage 460, the gate current ($I_{GATE}$) 108", 108'" is at magnitude $I_{S2}$ 462. This is represented figuratively in FIG. 3 by the switching on of current source $I_{S2}$ 306 and the switching off of current source 300. This current results in the speeding up, or minimization, of the switching time from when the turn off command 457 is received until the output voltage ($V_{OUT}$) 106", 106'" crosses back below the arbitrary threshold $V_{SCB}$ 434.

At this point, the output voltage slew rate 428' is controlled to reduce the ME emissions generated by the changing voltage, by setting the gate current ($I_{GATE}$) 108", 108'" to magnitude $I_B$ 432'. This is represented figuratively in FIG. 3 by the switching off of current source 306 and the switching on of current source 304. Stage 470 illustrates the resulting signal relationships.

In stage 480, it now becomes desirable to limit current slew rate 424', again for the purpose of managing radiant EM. To achieve this, the gate current 108", 108'" is limited to magnitude $I_A$ 422'. This is represented figuratively in FIG. 3 by current source 304 switching off and current source 302 switching on.

In the final stage 490 of "turn off" 457, the output current ($I_{OUT}$) 112", 112'" has fallen below threshold $I_{SR}$ 414. As such, there is no longer a need to exercise current slew rate limiting. Rather, the system is allowed to discharge the gate-source and gate-drain capacitances 110', 111'. This current is represented as $I_{GD}$ 492. When the gate-source voltage ($V_{gS}$) 436 returns to zero, the device is fully "off" 444'.

Thus, it can be appreciated that the present invention allows for effective turning on and turning off of a driven device according to a PWM input signal, while significantly reducing the resultant EM radiation, by controlling the gate current of a transistor according to the progression $$I_{GATE}: I_{s1} \Rightarrow +I_A \Rightarrow +I_B \Rightarrow +I_{CP1} \text{ for input=high,}$$

and $$I_{GATE}: I_{S2} \Rightarrow -I_A \Rightarrow -I_B \Rightarrow I_{GD} \text{ for input=low.}$$

The switched current sources described in the preceding paragraphs serve to limit the output current and voltage slew rates to reduce EM emissions, while allowing the device to switch as fast as possible by allowing higher currents during the phases where neither the output voltage or current is changing. The parameters that determine whether the output stage is in current slew rate limiting or voltage slew rate limiting mode are listed below in Table 1:

TABLE 1

| Stage | $I_{OUT}$ 112 | $V_{OUT}$ 106 | $I_{GATE}$ of Output Stage 108 | Comment |
|---|---|---|---|---|
| 410 | $<I_{SR}$ | $<V_{SR}$ | $I_{S1}$ | Speed-up current to decrease $t_{d\_ON}$; the device turn on time. $V_{GATE}$ rises to $V_{TH}$. |
| 420 | $>I_{SR}$ | $<V_{SR}$ | $|I_A|$ | Current slope limiting, at device turn-on. |
| 430 | $>I_{SR}$ | $>V_{SR}$ $<V_{SCB}$ | $|I_B|$ | Voltage slope limiting, at device turn-on. |
| 440 | $>I_{SR}$ | $>V_{SCB}$ | $I_{CP1}$ | Full device design capability so $R_{DSON}$ reduces to minimum. |
| 450 | $>I_{SR}$ | $>V_{SCB}$ | ≈0 | $R_{DSON}$ at minimum. |
| 460 | $>I_{SR}$ | $>V_{SCB}$ | $I_{S2}$ | Gate discharge speed-up current to increase $t_{d\_OFF}$, the device turn off time. |
| 470 | $>I_{SR}$ | $>V_{SR}$ $<V_{SCB}$ | $|I_B|$ | Voltage slope limiting, at device turn-off. |
| 480 | $>I_{SR}$ | $<V_{SR}$ | $|I_A|$ | Current slope limiting, at device turn-off. |
| 490 | $<I_{SR}$ | $<V_{SR}$ | $I_{GD}$ | Gate discharge |

Digital states are assigned to the comparison of the output $I_{OUT}$ 112 to the value $I_{SR}$ 414 and the output $V_{OUT}$ 106 to the values $V_{SR}$ 426 and $V_{SCB}$ 434, according to the following relationships:

$$[I_{OUT}<I_{SR}] \Rightarrow [ISR=\text{digital "0"}],$$

$$[I_{OUT}>I_{SR}] \Rightarrow [ISR=\text{digital "1"}],$$

$$[V_{OUT}<V_{SR}] \Rightarrow [VSR=\text{digital "0"}],$$

$$[V_{OUT}>V_{SR}] \Rightarrow [VSR=\text{digital "1"}],$$

$$[V_{OUT}<V_{SCB}] \Rightarrow [VSCB=\text{digital "0"}],$$

and $$[V_{OUT}>V_{SCB}] \Rightarrow [VSCB=\text{digital "1"}].$$

Figure 5A:
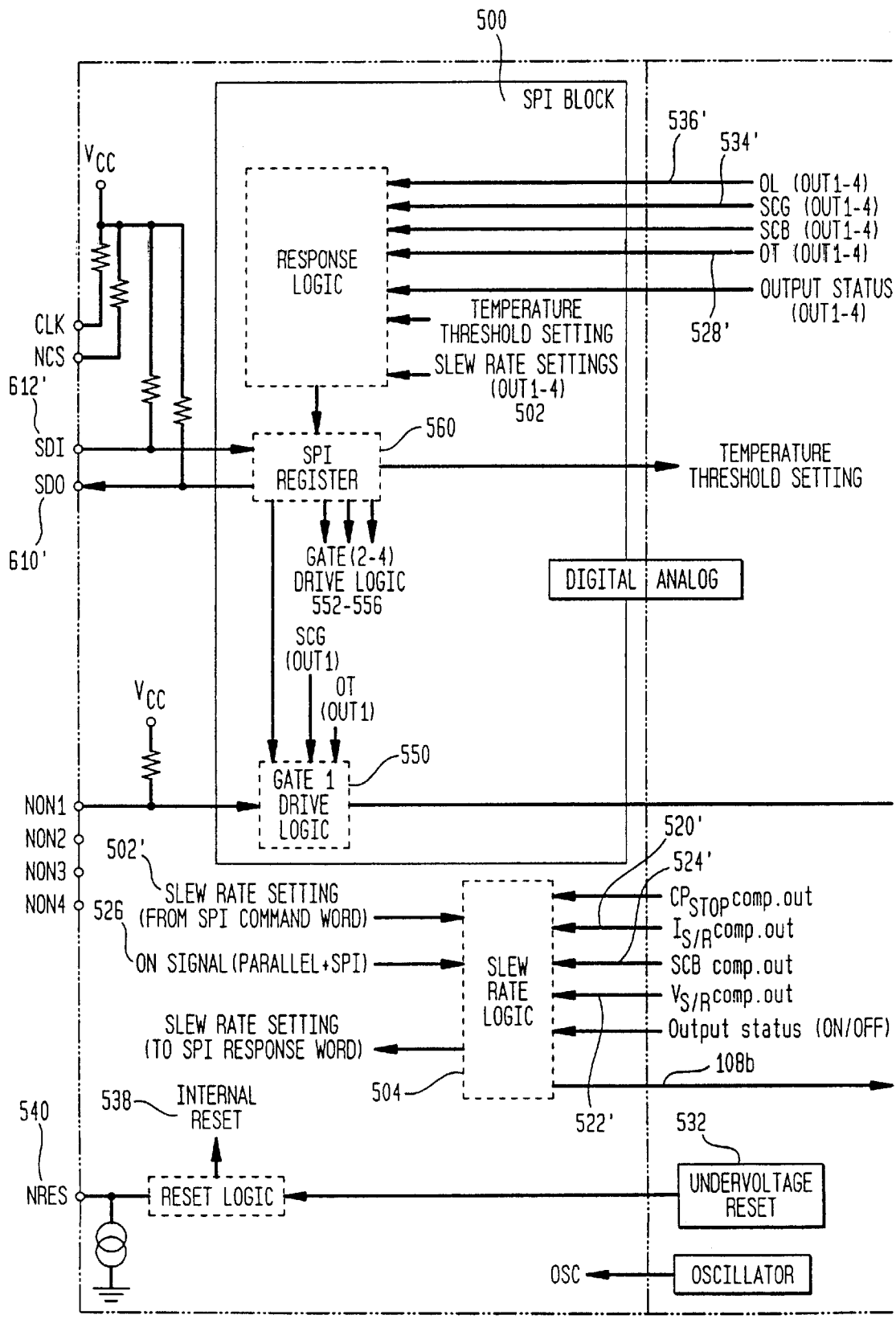
FIG. 5 is block diagram of a control circuit employing the slew rate limiting of the present invention.
Figure 5B:
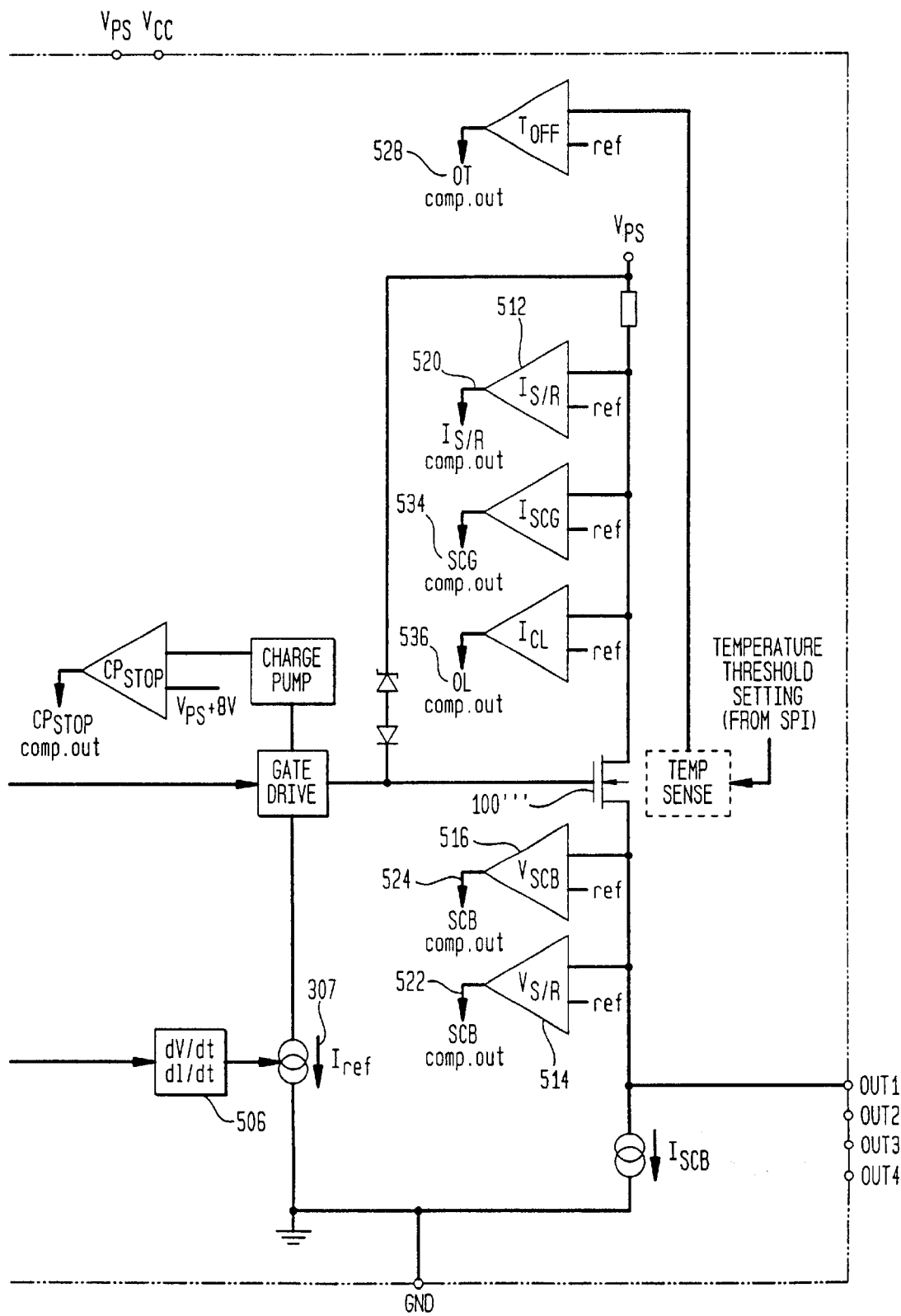

It should be noted that ISR as discussed here is signal 520, VSR is signal 522 and VSCB is signal 524 of FIG. 5.

Having made this transformation from analog logic to digital logic, one of ordinary skill in the art can readily appreciate that a combination of analog and digital control devices can be employed to optimize control of the current and voltage slew rates. More particularly, one of ordinary skill can further appreciate the advantages of mixing digital and analog signal control techniques. That is because a control circuit which includes digital devices can be much more readily varied to suit particular conditions. By being programmable, digital devices permit a number of different outputs based upon an input command.

To further illustrate this point, reference is now made to FIG. 5. A serial peripheral interface (SPI) logic circuit 500 is integrated into the device, to set various operating parameters, to control the drivers, and to read and interpret diagnostic information from the drivers. Alternatively, the SPI 500 may be an external semiconductor device, or may be a combination of external components arranged to achieve the desired circuit and logic behavior. This discussion will presume no specific physical implementation, as the physical embodiment of the SPI 500 is immaterial to obtaining a full understanding of the present invention.

The slew rate limit choice 502 is output by the SPI 500, and in turn is an input 502' to the combined digital 504 and analog 506 circuit embodying the current and voltage slew rate controls as described earlier. More particularly, the voltage slew rate is mathematically represented as $\partial V/\partial t$ and the current slew rate is mathematically represented as $\partial I/\partial t$. The SPI 500 of the present embodiment provides for four different settings for voltage and current slew rate limiting, with an example shown below in Table 2. One of ordinary skill in the art understands that determination of the number of slew rate settings and their values would preferably include the supply and load conditions under which these limits are valid. The parameter $t_{dON/OFF}$ is the maximum time allowed for the transistor to turn on or off (as shown in FIG. 4, states 446 and 444), where $t_{dON}$ is measured from the 50% voltage level of the ON signal to the point where $I_{OUT}=10\% \ I_{OUT\_MAX}$ (that being, 10% of its maximum level), and where $t_{dOFF}$ is measured from the 50% voltage level of the OFF signal to the point where $V_{OUT}=90\% \ V_{OUT\_MAX}$ (that being, 90% of its maximum level).

TABLE 2

| Slew Rate Range | $\partial V/\partial t$ (Volts/μsec) | $\partial I/\partial t$ (Amps/μsec) | $t_{dON/OFF}$ (μsec) |
| --- | --- | --- | --- |
| 0 | 0.2 → 0.8 | 0.05 → 0.25 | ≦20 μsec |
| 1 | 0.6 → 2.4 | 0.15 → 0.75 | ≦12 μsec |
| 2 | 1.8 → 7.2 | 0.45 → 2.3 | ≦5 μsec |
| 3 | 5.4 → 22.0 | 1.4 → 7.0 | ≦3 μsec |

For each slew rate limit, there is a tolerance inherent in the device. This is indicated in Table 2 by using a range of values for each limit, as opposed to using absolute values.

The settings of voltage and current slew rate limiting are selected to best fit the voltage and current limiting requirements of the application. As such, one of ordinary skill can appreciate that an application requiring a higher degree of EM emission reduction would likely select slew rate range 0 to provide for a slow slew rate, while an application whose speed requirements supercede its emissions requirements would select the faster slew rate of range 3.

It should be emphasized that the current and voltage slew rate limiting are accomplished internally to the device of the present invention, and as such require no additional or external means to achieve these controls.

Represented in functional block diagram format, the transistor 100''' turn-on time is limited by control current 307. To accomplish the logic of Table 1, the output current and output voltage signals are digitized by a series of comparators. More particularly, comparator 512 digitizes the relationship of $I_{OUT}$ with respect to threshold $I_{SR}$, comparator 514 digitizes the relationship of $V_{OUT}$ with respect to threshold $V_{SR}$, and comparator 516 digitizes the relationship of $V_{OUT}$ with respect to threshold $V_{SCB}$. The outputs 520–524 of these relationships are fed back to 520'–524' to the digital logic portion 504 of the slew rate limit determiner. The "on" signal 526 is similarly fed into the slew rate logic 504, where here that signal is the PWM input into the gate 401. The values of these signals 520'–524', 526 are used as shown in Table 1 to determine the appropriate slew output setting 108b.

While not necessary to an understanding of the advantages of the invention, is can be appreciated that it may be preferred to include certain protections within the circuit to prevent certain situations from being permitted to prevail. For example, the embodiment of FIG. 5 as further illustrated in FIG.6 includes logic to detect and react to situations such as circuit overtemperature 528, 528', circuit undervoltage 532, short circuits to ground (SCG) 534, 534', and open load (OL) 536, 536' conditions. Additionally, it is customary for digital control circuits to include logic to detect and react to both internal 538, 538' and externally-generated 540, 540' reset signals.

As shown here, a single gate driver 550 is fully detailed. However, it can be appreciated that multiple gates may be driven, such as shown here where three additional gates 552–556 are driven in like fashion.

Figure 6A:
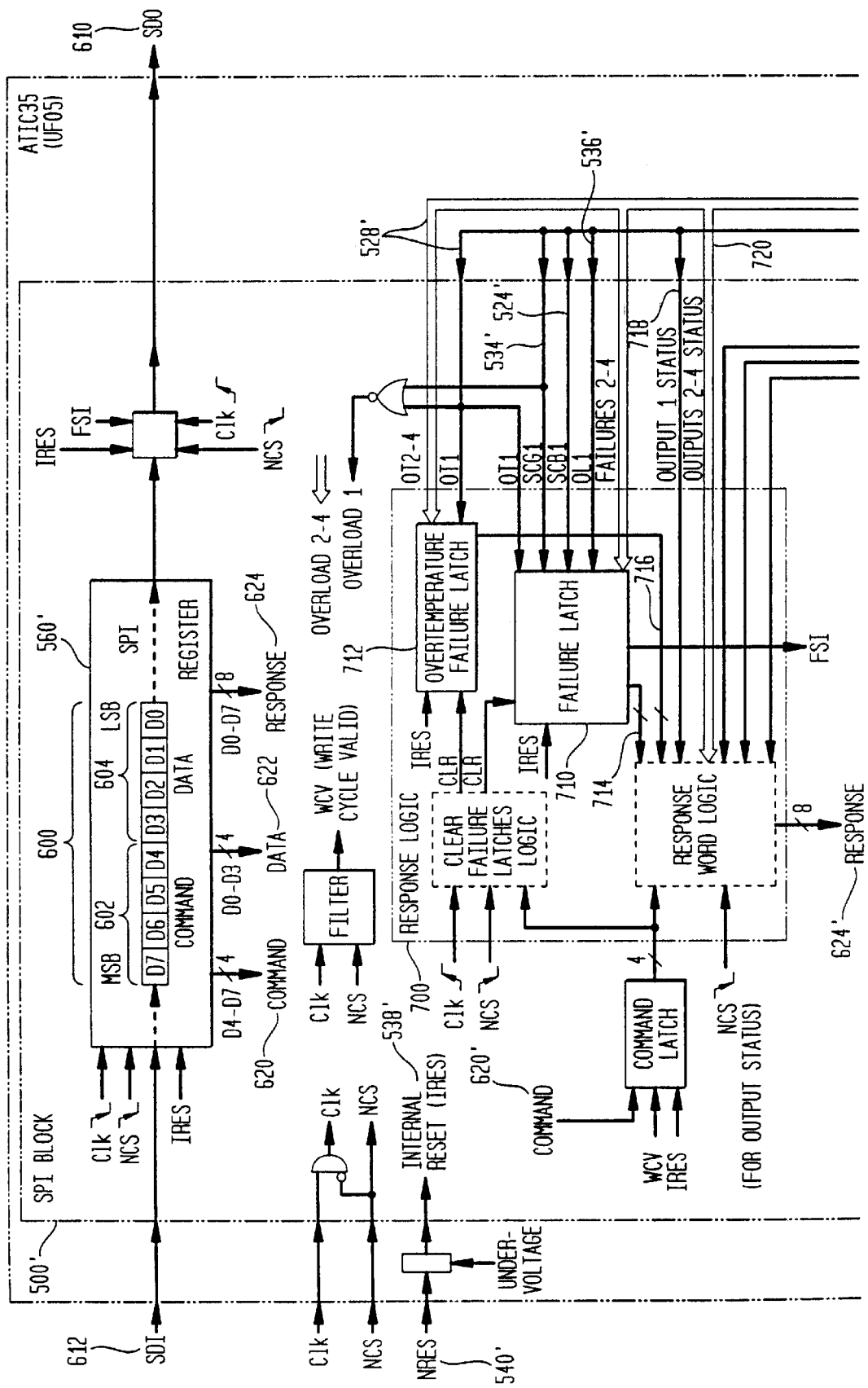
FIG. 6 is a block diagram of the serial peripheral interface that permits digital adjustment of the voltage and current slew rate limits.
Figure 6B:
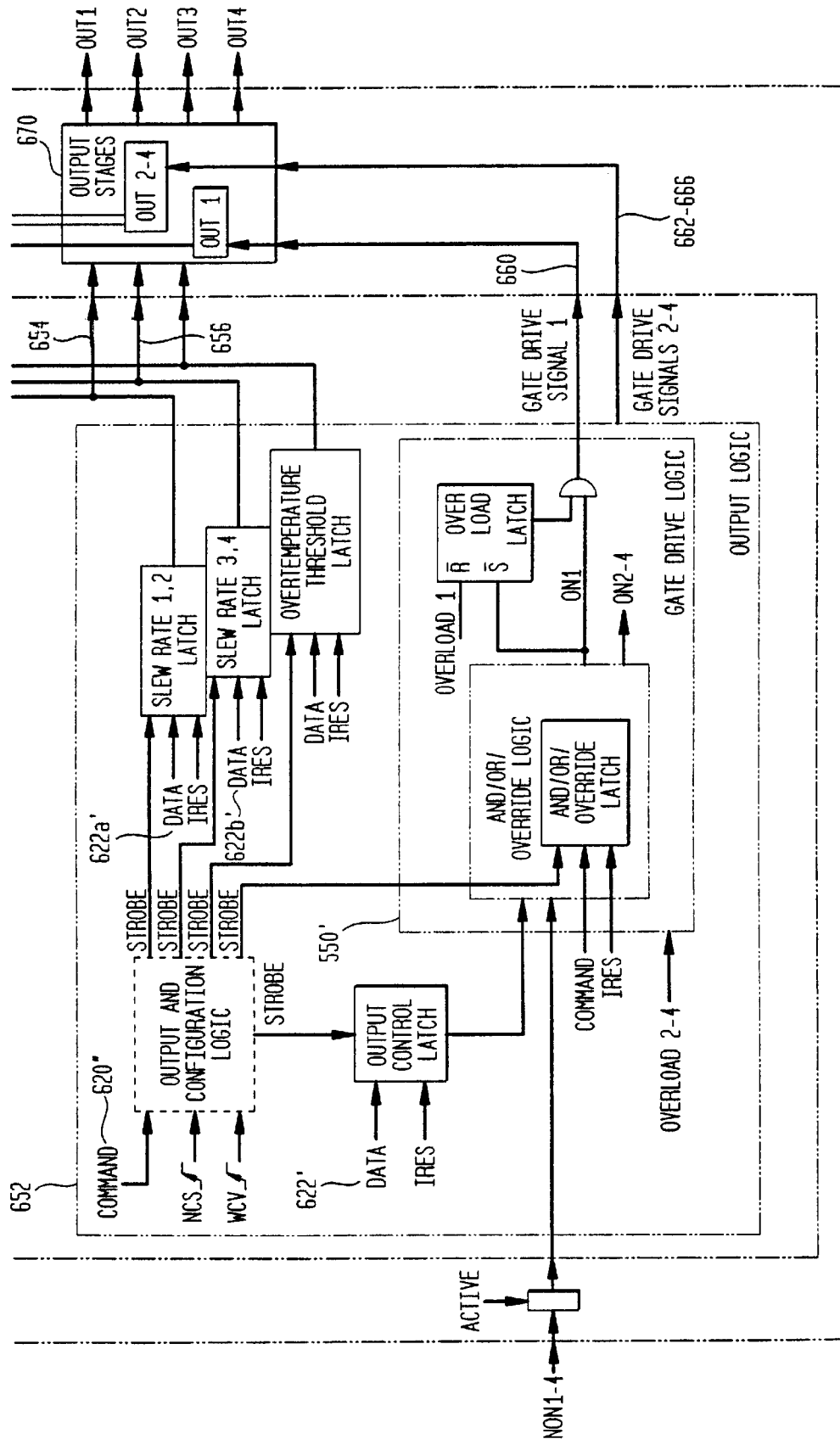

Turning our attention now primarily to FIG. 6, the operation of the SPI 500' of the preferred embodiment is more fully explained. It can of course be appreciated that much of this discussion is within the realm of design choices made by someone of ordinary skill in the art. A SPI register 560, 560' communicates with the circuit at large through an eight-bit message byte 600. This message 600 includes two portions, a four-bit command nibble 602 and a four-bit data nibble 604. Besides being used within the circuit of the present invention, this message 600 may also be output to other digital communications devices external to the circuit via the serial data output (SDO) line 610, 610'. Likewise, the circuit of the present invention may receive communications from such external devices through the serial data input (SDI) line 612, 612'.

The SPI register 560' is adapted to alternately communicate commands 620 and data 622 to control the operation of the control circuit as has been described earlier, and to receive response data 624 indicative of the performance of the control circuit in response to the commanded behaviors. When commanding slew rate settings to the circuit, the SPI register 560' structures the eight-bit message byte 600 such that bits D4–D7 (i.e., the command nibble 620) indicates which pair of channels are to be set. A binary message of "1011" indicates that channels 1 and 2 are to be set during this control cycle, while a binary message of "1101" indicates that channels 3 and 4 are to be set. The data nibble 622 provides the actual slew rate range settings, with bits D2 and D3 providing the settings applicable to channels 2 and 4, while bits D0 and D1 provide the settings applicable to channels 1 and 3. Referring back to Table 2, to set slew rate ranges 0 through 3, the ranges are represented in binary fashion in the appropriate setting bits.

By way of example, to set the slew rate of channel 1 to range 2 and to set the slew rate of channel 2 to range 1, the following message would be sent by the SPI register:

| D7 | D6 | D5 | D4 | D3 | D2 | D1 | D0 |
|----|----|----|----|----|----|----|----|
| 1  | 0  | 1  | 1  | 0  | 1  | 1  | 0  |

Such a message indicates that channels 1 and 2 are being set (D4–D7=1011), that channel 2 should be set to range 1 (D2–D3=01), and that channel 1 should be set to range 2 (D0–D1=10). The command 620 and data 622 portions of the message are transmitted to the gate drive logic 550, 550' and output control logic 652 circuits via signals 620', 620", 622', 622a' and 622b'. The gate drive logic 550, 550' takes the slew rate command 622' and, in combination with the slew settings 622a' and 622b' as latched by the output logic 652, produces a drive signal 660 and setting signals 654, 656 to drive the output stage 108a, 670 of the transistor 100'".

Having sent its slew rate setting command, the SPI register 560' now begins to listen for the response 624. This response provides feedback as to how the circuit is performing in response to the commanded behaviors. The output stage 670 signals are fed back into the response logic portion 700 of the circuit. Likewise, the various voltage and current levels 524', 528', 534' and 536' are fed back, to indicate whether or not the various thresholds set forth in Table 1, as well as the various circuit protection thresholds for SCB, SCG and OL, have been reached. If any of the protection thresholds 524', 528', 536' have been reached, a latch in the failure register 710 is set. In this embodiment, another register, dedicated strictly to overtemperature reporting 712, is also included. A latch is this register is set if any of the channels is in an overtemperature mode, whereas the failure register 710 contains data about any channel which has exceeded a protection threshold.

The protection latch states 714, 716 are combined with the desired rate commands 654, 656 and with the actual output states 718, 720 to form the response message 624'. For the response byte that contains slew rate information, bits D7 and D6 indicate the actual slew rate of channel 4, bits D5 and D4 indicate the rate of channel 3, D3 and D2 indicate channel 2, and D1 and D0 indicate channel 1. For each channel, its slew rate range, as discriminated according to Table 2, is represented in binary fashion. By way of example, if the response message 624 appears as below:

| D7 | D6 | D5 | D4 | D3 | D2 | D1 | D0 |
|----|----|----|----|----|----|----|----|
| 1  | 0  | 1  | 1  | 0  | 1  | 1  | 0  | this means that channel 4 is at slew range 2, channel 3 is at range 3, channel 2 is at range 1, and channel 1 is at range 2. These statuses may then be sent in a message to external devices via the SDO 610.

One of ordinary skill in the art should appreciate some additional points. First, the slopes of the voltage and current rate should be set to meet the circuit response and EM radiation control needs of the circuit. Further, the number of slew ranges, and the respective values within each range, may be narrowed or increased as the situation requires.

This preferred embodiment is for a high-side driver. However, to operate a low-side power stage, the load and the fly diode should be connected to battery. Similarly, to operate an H-bridge, a combination of high-side and low-side power stage slew rate limiting would be needed.

If improved delay times are not a requirement of the particular circuit design, one may eliminate the ISR and/or the VSB comparators. Conversely, if the situation requires it, the current and voltage slew rates can be set separately, rather than in combination as shown here.

The SPI 500, 500' may be adapted to communicate more fully with external devices. For example, if the circuit of the present invention is implemented as a part of a large digital control system, as is the case in the preferred embodiment, the SPI can be adapted to query and provide additional diagnostic information about the circuit. To illustrate this additional functionality, reference is now made to Table 3, below.

TABLE 3

| Command narrative | Command nibble 602 | Data nibble 604 | Reply |
|---|---|---|---|
| Set slew rates for channels 1 and 2 | 1011 | [rate 1] [rate 2] | Actual slew rates of all channels |
| Set slew rates for channels 3 and 4 | 1101 | [rate 3] [rate 4] | Actual slew rates of all channels |
| AND [data] with parallel inputs | 0001 | [data] | 2-bit diagnostic for each channel |
| OR [data] with parallel inputs | 0010 | [data] | 2-bit diagnostic for each channel |
| OVERRIDE parallel inputs with [data] | 0100 | [data] | 2-bit diagnostic for each channel |
| Set OT (overtemperature) threshold | 1000 | $T_{OFF1}$ = [0011] or $T_{OFF2}$ = [1100] | $T_{OFF1}$ = [00000011] or $T_{OFF2}$ = [11111100] |
| Read status of outputs and OT latches | 1110 | [xxxx] don't care | output state and OT status for each channel |

Regarding the AND, OR and OVERRIDE diagnostic commands outlined above, it should be noted that the 2-bit diagnostic for each channel takes the form of:

| D7 | D6 | D5 | D4 | D3 | D2 | D1 | D0 |
|----|----|----|----|----|----|----|----|
| Ch4 | Ch4 | Ch3 | Ch3 | Ch2 | Ch2 | Ch1 | Ch1 | where:
"00"=SCG/OT situation present
"01"=OL situation present
"10"=SCB situation present
"11"=no protection situations present (i.e. OK)

Similarly, for the READ diagnostic command outlined above, it should be noted that the response takes the form of:

| D7 | D6 | D5 | D4 | D3 | D2 | D1 | D0 |
|----|----|----|----|----|----|----|----|
| OT4 | OT3 | OT2 | OT1 | Out4 | Out3 | Out2 | Out1 | where:
OTx="0"=no overtemperature situation present
Otx="1"=overtemperature situation present
Outx="0"=channel is off, i.e. $V_{OUT} < V_{SCB}$
Outx="1"=channel is on, i.e. $V_{OUT} > V_{SCB}$ Because the SPI 500 can communicate with other digital devices through the SDI 612' and SDO 610' lines, it can be appreciated that the slew rate ranges of Table 2 could be altered during operation, as commanded by an external device to the SPI.

One of ordinary skill appreciates that other commands may be implemented depending upon the needs of the situation. However, it can nonetheless be appreciated that combining digital and analog control techniques, as described herein, provides an elegant solution to the problem of minimizing radiant EM while still providing desired circuit response characteristics. It can also be appreciated that combining digital and analog control techniques permits controls to be dynamically adjusted as needed.

The foregoing description of the preferred embodiment was provided to illustrate the concepts of the present invention. However, other embodiments of the present invention may be effected without departing from the spirit or scope of the invention claimed herein.

We claim:

1. A device having at least one transconducting element, for controlling the current of an inductive load through a control signal, said device comprising:

a current slew rate limiter operable to provide a control input to the transconducting element;

a voltage slew rate limiter operable to provide the control input to the transconducting element; and a logic device in signal communication with the current slew rate limiter and the voltage slew rate limiter, the current slew rate limiter responding to the logic device to provide the control input at one of a first plurality of selectable current slew rate control levels and then changing to at least a second one of the first plurality of control levels during a current slew cycle of the transconducting element, the voltage slew rate limiter responding to the logic device to provide the control input at one of a second plurality of selectable voltage slew rate control levels and then changing to at least a second one of the second plurality of control levels during a voltage slew cycle of the transconducting element.

2. The device of claim 1, wherein said voltage and current slew rate limiters modulate the control input to the transconducting element.

3. The device of claim 2, wherein the modulated input signal comprises voltage and current modulation.

4. The device of claim 3, wherein the voltage modulation is a pulse width modulated signal.

5. The device of claim 4, wherein the current modulation is asynchronous.

6. The device of claim 3, wherein the current modulation is asynchronous.

7. The device of claim 6, wherein the transconducting element has an output current and an output voltage and wherein said asynchronous current modulation is determined as a function of said output current and said output voltage.

8. The device of claim 1, wherein the control input comprises a gate current of the transconducting element.

9. The device of claim 1, wherein the transconducting element comprises a transistor.

10. A device for controlling the current of an inductive load having at least one transistor having a gate input, said device controlling said inductive load current by controlling a current and a voltage of said transistor gate input, wherein said transistor gate input voltage control comprises a voltage slew rate limiter having at least one predetermined voltage slew rate range for varying the rate at which the voltage slew of said transistor gate input increases and decreases, the voltage slew rate limiter employing the inherent Miller Effect of the transistor as a closed loop control, and wherein said transistor gate input current control comprises a current slew rate limiter having at least one predetermined current slew rate range for varying the rate at which the current slew of said transistor gate input increases and decreases; and a logic device in signal communication with said voltage slew rate limiter and said current slew rate limiter, the current slew rate limiter responding to the logic device to provide the gate input at one of a first plurality of selectable current slew rate control levels and then changing to at least a second one of the first plurality of control levels during a current slew cycle of the transistor, and by the voltage slew rate limiter responding to the logic device to provide the gate input at one of a second plurality of selectable voltage slew rate control levels and then changing to at least a second one of the second plurality of control levels during a voltage slew cycle of the transistor.

11. The device of claim 10, wherein the transistor is arranged such that each time the gate voltage cycles off the transistor is turned off.

12. The device of claim 10, wherein said device selectively enables and disables the current slew rate limiter.

13. The device of claim 10, wherein said device selectively enables and disables said voltage slew rate limiter.

* * * * *